United States Statutory Invention Registration [19]

[11] Reg. Number: H322

Simons [43] Published: Aug. 4, 1987

[54] LASER DIODE POWER CONTROLLER

[75] Inventor: Brent S. Simons, Santa Clara, Calif.

[73] Assignee: The United States of America as represented by the Secretary of the Navy, Washington, D.C.

[21] Appl. No.: 757,222

[22] Filed: Jul. 22, 1985

[51] Int. Cl.[4] ..... H01S 3/13; H01S 3/19; H01L 31/12

[52] U.S. Cl. ..... 372/29; 372/38; 372/50; 372/31; 357/19

[58] Field of Search ..... 372/29, 31, 38, 50; 357/19

[56] References Cited

U.S. PATENT DOCUMENTS 4,305,047 12/1981 Chapman et al. ..... 372/46

*Primary Examiner*—Stephen C. Buczinski
*Assistant Examiner*—Linda J. Wallace
*Attorney, Agent, or Firm*—C. D. B. Curry

[57] ABSTRACT

A laser diode power supply that uses a proportional controller that drives a series pass transistor to regulate laser diode current and the intensity of the laser diode output. The purpose of the controller is to maintain constant laser output power when its unregulated output power would otherwise gradually decrease with age. The laser diode includes a detector that samples light emitted from the laser diode. The output of the detector is amplified and compared to a reference voltage in an integrator. The output of the integrator controls a series pass transistor that varies to power to the laser diode to provide a constant laser diode power output. The controller also includes power limiting and transient voltage protection circuits.

3 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LASER DIODE POWER CONTROLLER

BACKGROUND OF THE INVENTION

1. Field of the Invention

This invention relates to an electrical control circuit and more particularly to a laser diode power supply current control circuit.

2. Description of the Prior Art

Many different types of current control circuits have been developed for use with electronic equipment. However, the unique problems associated with certain laser diode technology has not been solved with prior circuitry. One of these problems has been that the power output of a laser diode decreases as it ages and it is desirable to maintain a constant power level over its entire life cycle. It is also important that the control circuit have the ability to inhibit laser output by an external control level and be free of transient voltages which might damage the laser diode during turn on and off. The present invention overcomes these difficulties by employing a proportional controller which drives a series pass transistor to regulate laser diode current and thus the intensity of the laser diode output. A silicon detector located near the laser provides a current output proportional to laser power for feedback purposes.

SUMMARY OF THE INVENTION

It is an object of the present invention to provide a laser diode power supply controller for maintaining a constant laser output power level by varying the laser drive current as the laser ages.

Another object of the present invention is to control the current to a laser diode to maintain a constant current output and be free of transient voltages which might damage the laser diode during turn on and off.

Still another object of the present invention is to maintain a constant laser diode power output using a proportional controller which drives a series pass transistor to regulate laser diode current and the intensity of the laser diode output.

These and other objectives are accomplished by a laser diode power supply that uses a proportional controller that drives a series pass transistor to regulate laser diode current and the intensity of the laser diode output. The purpose of the controller is to maintain constant laser output power when its unregulated output power would otherwise gradually decrease with age. The laser diode includes a detector that samples light emitted from the laser diode. The output of the detector is amplified and compared to a reference voltage in an integrator. The output of the integrator controls a series pass transistor that varies to power to the laser diode to provide a constant laser diode power output. The controller also includes power limiting and transient voltage protection circuits.

Other advantages and features will become apparent from the following description of the preferred embodiment when considered in conjunction with the accompanying drawings wherein:

DESCRIPTION OF THE PREFERRED EMBODIMENT

Figure 1:
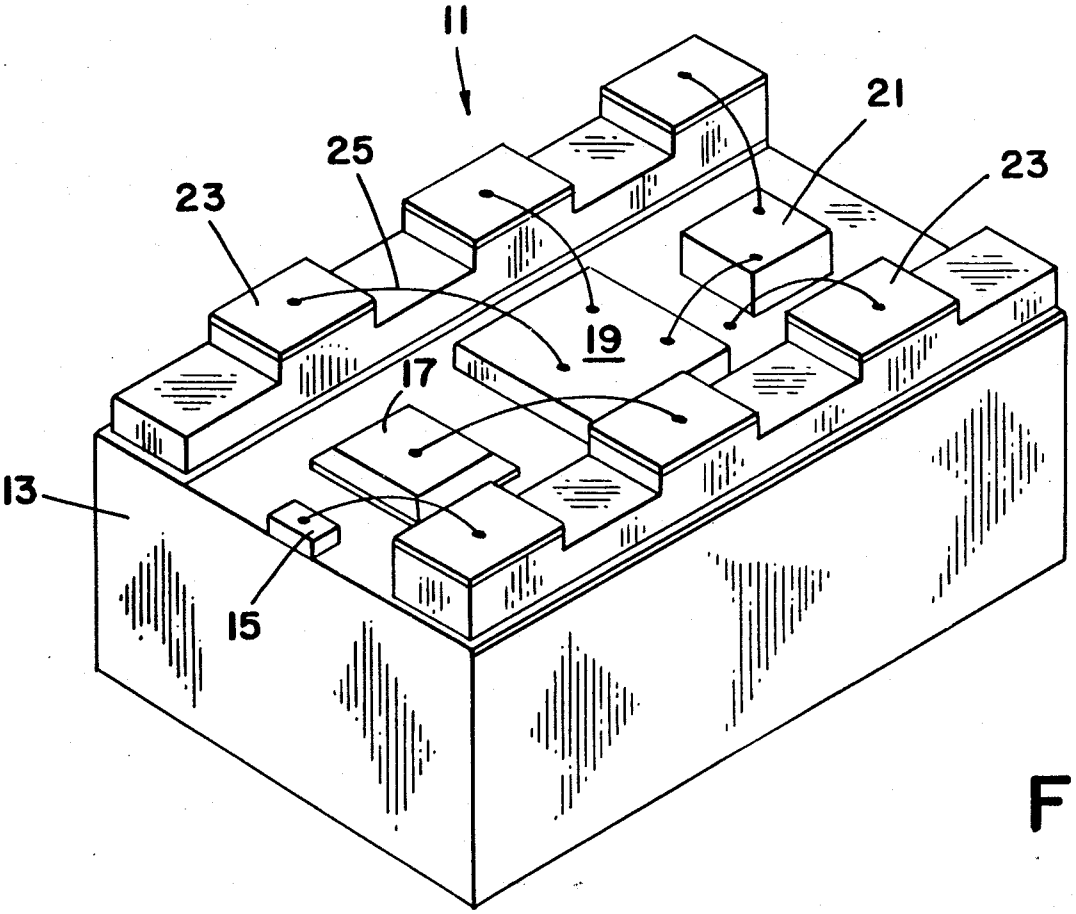
FIG. 1 is a pictorial drawing of the laser diode assembly which uses the laser diode power supply controller of the present invention.

In FIG. 1 is shown a pictorial view of the solid-state laser diode assembly 11 which uses the laser diode power supply controller of the present invention. The laser diode assembly of FIG. 1 includes base 13, laser diode 15, photodetector 17, temperature sensor 19, calibration resistor 21 wire bond connection pads 23 and connecting wires 25.

Figure 2:
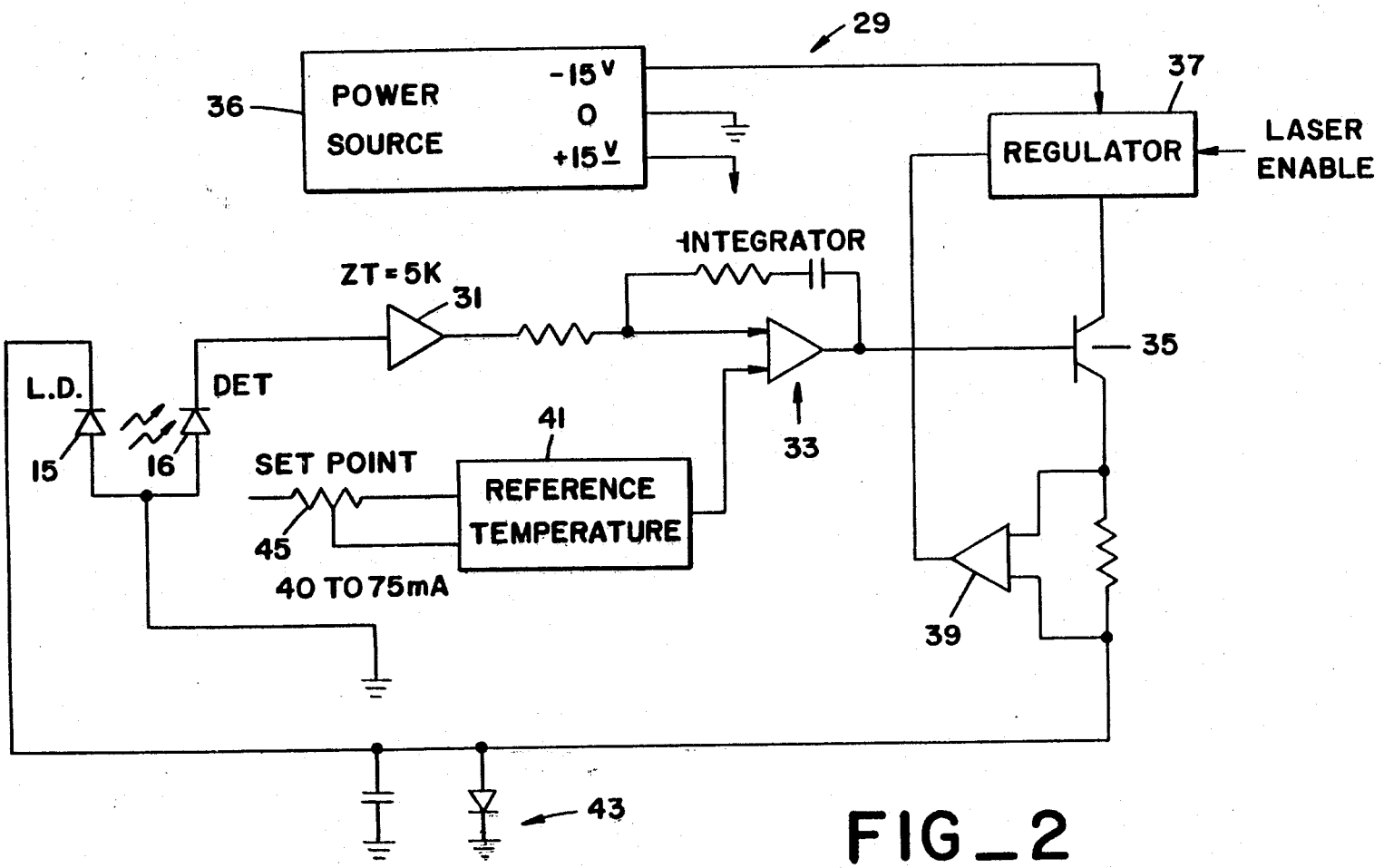
FIG. 2 is a schematic diagram of the laser diode power supply controller of the present invention.

In FIG. 2 is shown the laser diode power supply controller 29 of the present invention. Controller 29 includes transimpedance amplifier 31, integrator 33, series pass transistor 35, power source 36, regulator 37, current sense amplifier 39, reference voltage device 41 and transient voltage protection circuit 43.

The outputs of laser diode 15 and photodetector 16 are connected to controller 29 as illustrated. The reference voltage for integrator 33 is externally established by variable resistor 45. Circuit grounding and electrical parameters for this embodiment are as illustrated in FIG. 2. An external laser enable signal is applied to one of the inputs to regulator 37.

The system requirements of the illustrated embodiment are to provide a control circuit 29 that is capable of driving a 10 milliwatt laser diode which maintains a constant laser output power level by varying the laser drive current as the laser ages. A silicon detector located near the laser provides a current output proportional to laser power for feedback control purposes. The controller has the ability to inhibit laser output by an external control level. The laser diode power supply employs a proportional controller which drives a series pass transistor to regulate laser diode current and thus the intensity of the laser diode output. Since the output power of a laser diode gradually decreases with age, it is necessary to provide a compensation circuit that will maintain constant laser output power over time.

The laser diode hybrid 15 contains a small silicon detector 16 mounted directly behind the laser diode chip which samples a small amount of light emitted from the back facet of the laser. The output current of silicon detector 16 is typically around 50 micro-amps for a 10 milliwatt laser. This current is converted to a voltage output by transimpedance amplifier 31. Integrator 33 compares the power sense output voltage of amplifier 31 to a preset reference level, as determined by variable resistor 45 and reference voltage device 41, which sets the desired laser output level of10 milliwatts, for example. Any change in detected light adjusts the laser drive current in the proper direction to maintain a constant output power level.

Regulator 37 in this embodiment is an integrated circuit controlled by an external voltage level. An external input (laser enable) from temperature controller 19 prevents the regulator from turning on unless the laser temperature is within 5 degrees of set point. In addition, the regulator employs a slow turn on and off circuit to prevent the possibility of voltage transients occurring during power-up and shut down. Current sense amplifier 39 samples the laser drive current and provides a current limit control to regulator 37 which prevents damage to the laser diode.

Obviously many modifications and variations of the present invention are possible in the light of the above teachings. It is therefore to be understood that with the scope of the appended claims the invention may be practiced otherwise than as specifically described.

What is claimed is:

1. A power supply controller for a laser diode including:

(a) a detector for receiving light emitted from the back facet of the laser diode;

(b) an amplifier, an integrator, a reference voltage generator, a power source and a series pass transistor;

(c) the output of said detector being applied to the input of said amplifier, the output of said amplifier being applied to a first input of said integrator, the output of said reference voltage generator being applied to a second input of said integrator, the output of said integrator being applied to the base of said series pass transistor, the output of said power source being passed through said series pass transistor to the power input of said laser diode; whereby (d) the voltage output of said reference voltage generator is selected to establish a preselected output power from said laser diode and said integrator provides an output signal to said series pass transistor to adjust the power applied to the power input of said laser diode to maintain constant laser output power.

2. The controller of claim 1 including:

(a) a regulator operably connected between said power source and said series pass transistor, said regulator being responsive to a laser enable signal and providing a slow increase of turn-on power and a slow decrease of turn-off power in response to said enable signal.

3. The controller of claim 2 including:

(a) a current sensing device operably connected between said series pass transistor and said laser diode and having its output connected to an input of said regulator to limit the maximum power applied to said laser.

* * * * *